United States Patent
Das et al.

(10) Patent No.: US 10,411,731 B1
(45) Date of Patent: Sep. 10, 2019

(54) DEVICE AND METHOD OF COMPRESSING DATA USING TIERED DATA COMPRESSION

(71) Applicant: Advanced Micro Devices, Inc., Santa Clara, CA (US)

(72) Inventors: Shomit N. Das, Austin, TX (US); Matthew Tomei, Champaign, IL (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/140,025

(22) Filed: Sep. 24, 2018

(51) Int. Cl.
| | |
|---|---|
| H03M 7/34 | (2006.01) |
| H03M 7/40 | (2006.01) |
| H03M 7/30 | (2006.01) |
| H03M 13/00 | (2006.01) |
| H03M 5/00 | (2006.01) |
| G06T 9/00 | (2006.01) |
| H03M 7/00 | (2006.01) |
| H04N 19/134 | (2014.01) |
| H04N 19/103 | (2014.01) |

(52) U.S. Cl.
CPC ....... *H03M 7/4006* (2013.01); *H03M 7/6047* (2013.01); *H03M 13/6312* (2013.01); *G06T 9/00* (2013.01); *H03M 5/00* (2013.01); *H03M 7/00* (2013.01); *H04N 19/103* (2014.11); *H04N 19/134* (2014.11)

(58) Field of Classification Search
CPC .. H03M 7/00; H03M 5/00; G06T 9/00; H04N 19/134; H04N 19/103
USPC ...... 341/51, 50; 375/240.01, 240.11, 240.13; 382/232
See application file for complete search history.

(56) References Cited

U.S. PATENT DOCUMENTS 8,531,321 B1 * 9/2013 Rossato ................ H04N 19/46
341/51

OTHER PUBLICATIONS

Alameldeen, A. et al., "Frequent Pattern Compression: A Significance-Based Compression Scheme for L2 Caches", 14 pgs., Technical Report 1500, Computer Sciences Dept., University of Wisconsin, Madison, WI, Apr. 2004.
Chen, X., et al., C-pack: A High Performance Microprocessor Cache Compression Algorithm IEEE Transactions on Very Large Scale Integration Systems, vol. 18, Issue 8, pp. 1196-1208, Aug. 2010, IEEE Educational Activities Department, Piscataway, NJ, USA.

(Continued)

*Primary Examiner* — Joseph J Lauture
(74) *Attorney, Agent, or Firm* — Volpe and Koenig, P.C.

(57) ABSTRACT

A processing device is provided which includes a plurality of encoders each configured to compress a portion of data using a different compression algorithm. The processing device also includes one or more processors configured to cause an encoder, of the plurality of encoders, to compress the portion of data when it is determined that the portion of data, which is compressed by another encoder configured to compress the portion of data prior to the encoder in an encoder hierarchy, is not successfully compressed according to a compression metric by the other encoder in the encoder hierarchy. The one or more processors are also configured to prevent the encoder from compressing the portion of data when it is determined that the portion of data is successfully compressed according to the compression metric by the other encoder in the encoder hierarchy.

20 Claims, 5 Drawing Sheets

(56) References Cited

OTHER PUBLICATIONS

Pekhimenko, G. et al., "Base-Delta Immediate Compression: Practical Data Compression for On-Chip Caches" Proceedings of the 21st International Conference on Parallel Architectures and Compilation Techniques, Sep. 19-23, 2012, pp. 377-388, ACM, Minneapolis, Minnesota, USA.

* cited by examiner

DEVICE AND METHOD OF COMPRESSING DATA USING TIERED DATA COMPRESSION

BACKGROUND

The constant movement of data (e.g., video data) at various memory hierarchies of on-chip network architectures increases the memory bandwidth (i.e., the rate at which the data is read from or stored into memory) as well as power consumption. To reduce memory bandwidth and power consumption, the data is typically encoded (e.g., compressed) using any number of different types of encoding (e.g., compression) techniques.

Conventional encoding techniques include compressing data at various stages of a data processing pipeline. For example, link compression techniques compress data at one side of link (e.g., a bus) and then transmit the compressed to another side of the link, where the compressed data is decompressed and stored in memory (e.g., cache memory). Link compression shares a model of the data at the encoding and decoding sides of the on-chip links to provide a high compression ratio (e.g., ratio between the uncompressed size of data and compressed size of the data or ratio between compressed data rate and uncompressed data rate), reducing the amount of data (or data rate) sent between links.

BRIEF DESCRIPTION OF THE DRAWINGS

A more detailed understanding can be had from the following description, given by way of example in conjunction with the accompanying drawings wherein.

DETAILED DESCRIPTION

Figure 1:
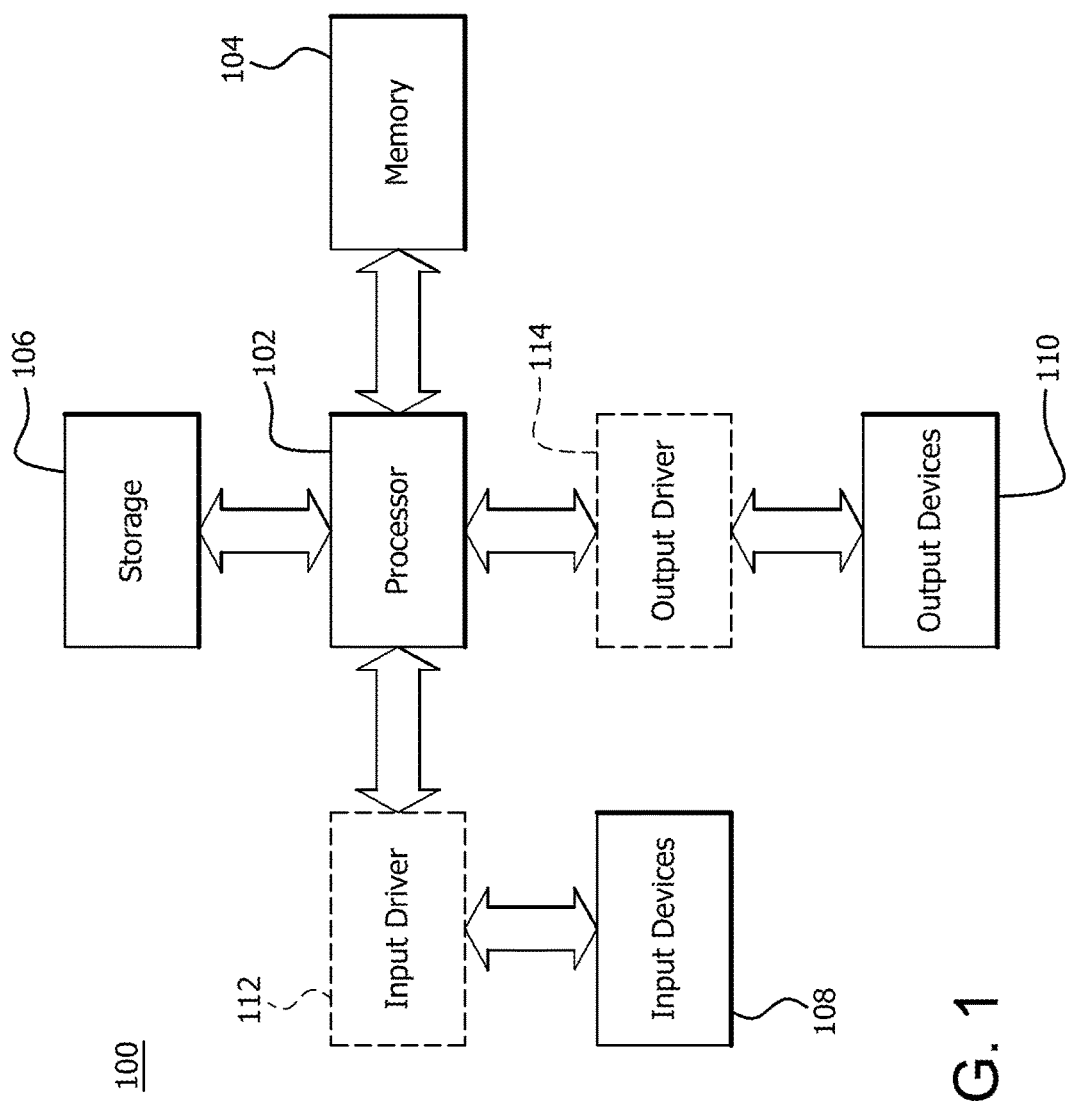
FIG. 1 is a block diagram of an example device in which one or more features of the disclosure can be implemented.

Some conventional compression techniques eliminate redundancy by using pattern matching for a commonly occurring word. Delta compression techniques utilize arithmetic operations to encode words as differences from a base word. Link compression often demands an integer reduction in encoded value size to eliminate bus cycles.

Hybrid techniques attempt to achieve higher compression ratios by combining processes (e.g., pattern matching and arithmetic operations) from different compression techniques. Hybrid techniques include multiple transformation processes during compression and decompression. For example, in some hybrid techniques, pattern matching and arithmetic operations are performed during compression before the encoded output value is determined as being available to be provided over a link. These multiple transformation processes increase the latency in both the compression and decompression processes.

The present application describes devices and methods which compress data according to an encoder hierarchy and provide the compressed data for decompression when it is determined that the data is successfully compressed according to a compression metric (e.g., compression ratio) by an encoder in the encoder hierarchy. The encoder hierarchy includes a plurality of encoders configured to compress data using compression algorithms having different levels of complexity. The encoders in the encoder hierarchy are arranged such that a first encoder, using a less complex compression algorithm (i.e., less complex encoder) than a second encoder (i.e., more complex encoder) in the encoder hierarchy, compresses a portion of data prior to the second encoder. The data that is successfully compressed according to the compression metric by an encoder is provided across a link of a processing device where the data is decompressed by one of a plurality of decoders each configured to decompress the data compressed by a corresponding encoder.

The devices and methods described herein reduce latency and power consumption in both the compression and decompression processes. For example, portions of data are not compressed by more complex encoders in the hierarchy when the portions of data are determined to be successfully compressed according to the compression metric by a less complex encoder. Accordingly, the compression latency and power consumption used to execute the program is reduced because the additional latency and power consumption, which would otherwise result from compressing the data using the more complex algorithms, is prevented. Further, the compression latency and power consumption is reduced without increasing the compression ratio because successful compression of each portion of data is determined according to a target compression ratio.

In addition, on the decompression side, because a single encoder is determined to successfully compress a portion of data according to the compression metric, a single decoder is activated to decompress each portion of compressed data of a program. Accordingly, the overall decompression latency and power consumption to execute the program is reduced because the decompression latency and power consumption, which would otherwise result from decompressing each portion of data according to the more complex algorithms, is prevented.

A processing device is provided which includes a plurality of encoders each configured to compress a portion of data using a different compression algorithm. The processing device also includes one or more processors configured to cause an encoder, of the plurality of encoders, to compress the portion of data when it is determined that the portion of data, which is compressed by another encoder configured to compress the portion of data prior to the encoder in an encoder hierarchy, is not successfully compressed according to a compression metric by the other encoder in the encoder hierarchy. The one or more processors are also configured to prevent the encoder from compressing the portion of data when it is determined that the portion of data is successfully compressed according to the compression metric by the other encoder in the encoder hierarchy.

A data processing method is provided which includes receiving a portion of data at a first encoder and a second encoder and compressing the portion of data at the first encoder using a first compression algorithm. When it is determined that the portion of data, compressed by the first encoder, is not successfully compressed according to a compression metric, the portion of data is compressed at the second encoder, which is configured to compress the portion of data after the first encoder in an encoder hierarchy, using a second compression algorithm different from the first algorithm. When it is determined that the portion of data, compressed by the first encoder in the encoder hierarchy, is successfully compressed according to the compression metric, the second encoder is prevented from compressing the portion of data.

A non-transitory computer readable medium having instructions for causing a computer to execute a data processing method which includes receiving a portion of data at a first encoder and a second encoder and compressing the portion of data at the first encoder using a first compression algorithm. The instructions also cause the computer to compress the portion of data at the second encoder, which is configured to compress the portion of data after the first encoder in an encoder hierarchy, using a second compression algorithm different from the first algorithm when it is determined that the portion of data, compressed by the first encoder, is not successfully compressed according to a compression metric. The instructions also cause the computer to prevent the second encoder from compressing the portion of data when it is determined that the portion of data, compressed by the first encoder in the encoder hierarchy, is successfully compressed according to the compression metric.

As used herein, programs include sequences of instructions to be executed using one or more processors to perform procedures or routines (e.g., operations, computations, functions, processes, jobs). Processing of programmed instructions and data includes one or more of a plurality of processing stages, such as but not limited to fetching, decoding, scheduling for execution, executing and decoding the programmed instructions and data. Programmed instructions include, for example, applications and control programs, such as operating systems.

FIG. 1 is a block diagram of an example device 100 in which one or more features of the disclosure can be implemented. The device 100 includes, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 also optionally includes an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), including dynamic RAM (DRAM) and static RAM (SRAM). The RAM includes cache memory, such as a data cache and a metadata cache, as described in detail herein.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

One or more components, such as processor 102, and memory 104 described herein are, for example, components a system on chip (SOC) used in an integrated circuit (e.g., application-specific chip) included in device 100.

Figure 2:
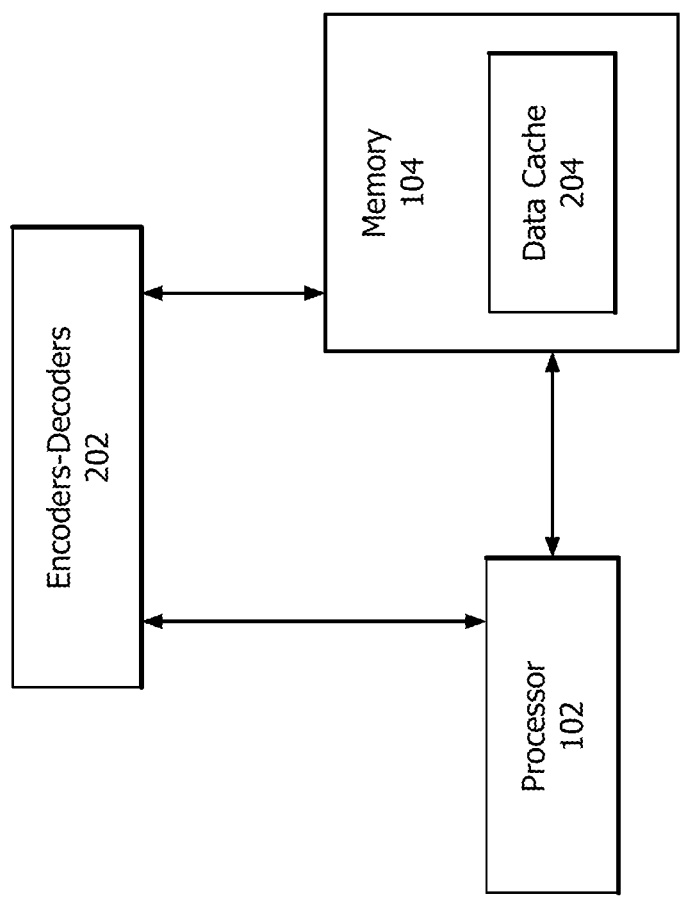
FIG. 2 is a block diagram illustrating exemplary components of a processing device in which one or more features of the disclosure can be implemented.

FIG. 2 is a block diagram illustrating exemplary components of a processing device 200 in which one or more features of the disclosure can be implemented. Processing device 200 is used to compress data (e.g., video data) using metadata caching to facilitate decompression of compressed data stored in the cache, as described in more detail below.

As shown in FIG. 2, processing apparatus 200 includes processor 102, memory 104 and a plurality of encoders-decoders 202 (e.g., encoders, decoders or combined encoders-decoders (i.e., CODECS)). Processor 102 is in communication with memory 104 and is configured to process data (e.g., read data, write data) using the memory 104 to execute the program. Encoders-decoders 202 are configured to compress and decompress data, such as video data using various encodings. Encoders-decoders 202 are, for example, implemented in hardware, software or a combination of hardware and software to compress data for executing a program. Encoders-decoders 202 are, for example, controlled by processor 102 to compress each portion of data using an encoding and decompress each portion of data using a decoding. Alternatively, one or more encoders-decoders 202 include a dedicated processor to compress and decompress the data. Each encoding and decoding is a way or a process of representing a portion of data to compress and decompress the portion of data. Memory 104 includes cache 204, which is a portion of memory 104, used to store data for executing a program. Processor 102 includes, for example, a cache controller configured to control the cache 204.

Figure 3:
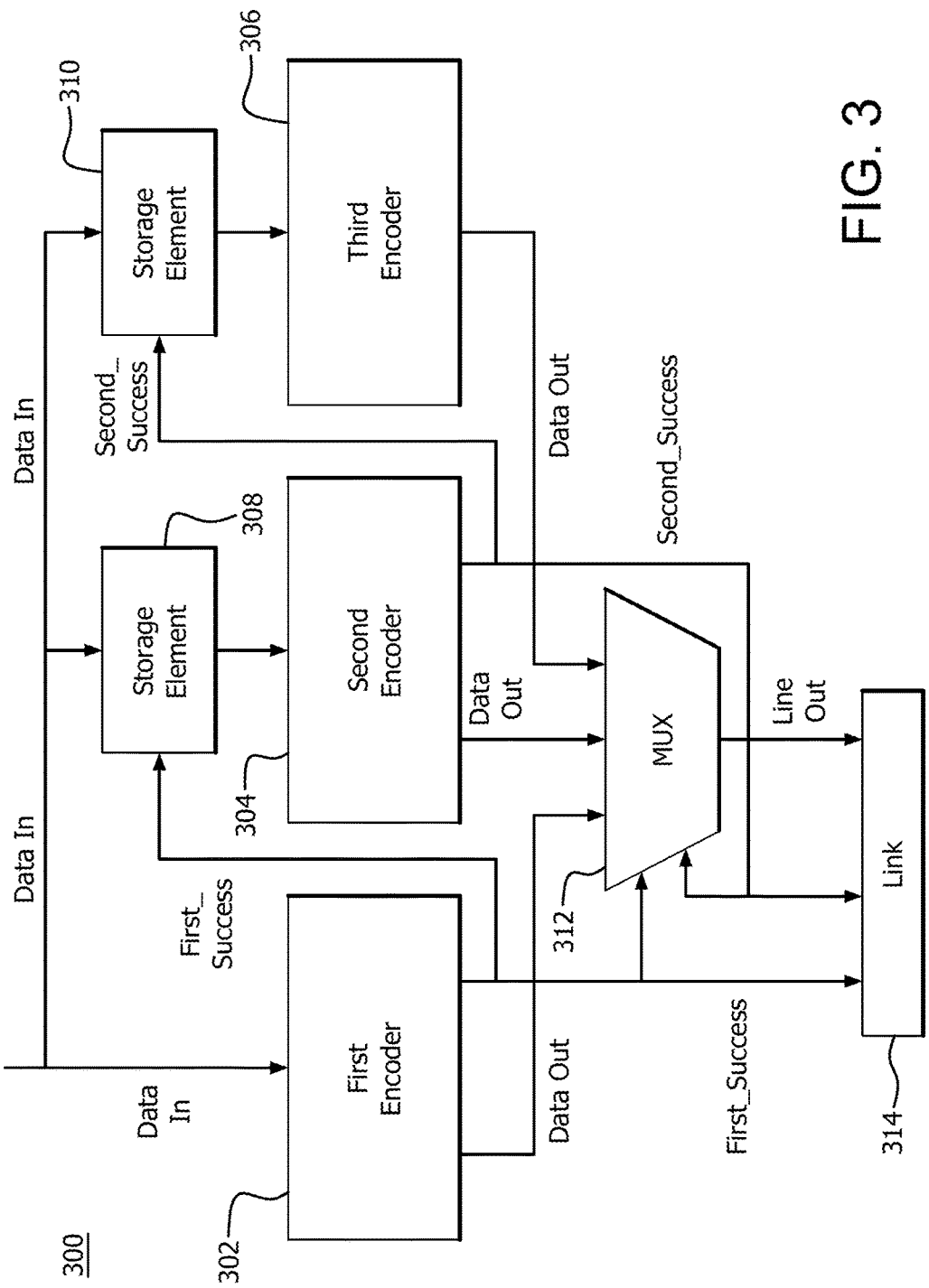
FIG. 3 is a block diagram illustrating an example flow of compressing data at a side of a link of a processing device in which one or more features of the disclosure can be implemented.

FIG. 3 is a block diagram illustrating an example flow of compressing data at a first side of a link 314 of a processing device 300. As shown in FIG. 3, the processing device 300 includes a first encoder 302, a second encoder 304 and a third encoder 306. The second encoder 304 is in communication with data storage element 308 and the third encoder 306 is in communication with data storage element 310. Three encoders and two data storage elements are shown in FIG. 3 for simplification purposes. Examples of processing devices used to implement features of the disclosure include a different number of encoders and data storage elements.

Each encoder 302, 304 and 306 is, for example, implemented in hardware (e.g., a part of encoder-decoder 202 shown in FIG. 2), software or a combination of hardware and software used to compress data for executing a program. When implemented in hardware, each encoder 302, 304 and 306 is, for example, a separate hardware component. Alternatively, each encoder 302, 304 and 306 is part of the same hardware component. Each encoder 302, 304 and 306 is, for example, controlled by processor 102 to compress each portion of data using a different compression algorithm.

Alternatively, each encoder 302, 304 and 306 includes a dedicated processor to compress the data using a different compression algorithm.

Each data storage element 308 and 310 is, for example, implemented in hardware as an electronic logic circuit which includes a plurality of inputs and a single output. For example, data storage elements described herein (e.g., storage elements 308 and 310) are latches that receive and store uncompressed data (i.e. Data In) and state information. The stored uncompressed data is either provided or not provided to a corresponding encoder 302, 304, 306 to be compressed depending on a state of each storage element 308, 310. The state of each storage element (e.g., storage element 308) is determined from an indication of whether another encoder (e.g., first encoder 302), which is configured to compress the portion of data prior to the corresponding encoder (e.g., second encoder 304) in an encoder hierarchy, successfully compressed data according to a compression metric, as described in more detail below. The implementation of the storage elements 308 and 310 allows the encoders 302, 304, 306 to receive the uncompressed data in parallel with each other, but compress the received data in a serial type manner depending on the states of storage elements 308 and 310.

Storage elements 308 and 310 are also implemented, for example, in software. Storage elements 308 and 310 and their corresponding states are defined, for example, as variables in programmed instructions executed by processor 102. For example, the instructions cause the processor 102 to control the scheduling of the encoders 302, 304 and 306 such that the uncompressed data is compressed in the serial type manner described above using a single thread. The instructions also, in some instances, cause the processor 102 to control the scheduling of the encoders 302, 304 and 306 such that the uncompressed data is compressed in parallel using multiple threads.

The processing device 300 also includes multiplexor (MUX) 312 configured to select one of the portions of compressed data (i.e., Data Out) received by first encoder 302, second encoder 304 and third encoder 306 to be provided over link 314 (e.g., a bus). MUX 312 is merely an example of combinational logic used to select and provide the compressed data over the link 314. Examples of other types of combinational logic include logic configured to provide data, across the link 314, which is compressed by more than one encoder, including portions of compressed data determined as not being successfully compressed according to a compression matrix.

As shown in FIG. 3, the processing device 300 is configured such that the first encoder 302, storage element 308 (corresponding to second encoder 304) and storage element 310 (corresponding to third encoder 306) each receive (e.g., receive in parallel) a portion of data to be compressed. First encoder 302 compresses the portion of data when the portion of data is received by the first encoder 302. The second encoder 304 and the third encoder 306 do not compress the portion of data, however, when the portion of data is received at their corresponding storage elements 308 and 310, respectively. Instead, the portion of data is stored by each storage element 308, 310 but is not provided to their corresponding encoders 304 and 306 for compression until it is determined that the preceding encoder (i.e., the encoder configured to compress the portion of data prior to the corresponding encoder in the encoder hierarchy), has not successfully compressed the portion of data according to a compression metric (e.g., a compression ratio).

The encoder hierarchy is, for example, determined prior to runtime of a program based on a complexity of the compression algorithm used by each encoder to compress data. Typically, more complex compression algorithms compress data at a higher compression ratio than less complex compression algorithms. The average cost to compress data, in terms of latency and power consumption, increases as the complexity of the compression algorithms increases. The encoders in the hierarchy are arranged (i.e., tiered), such that an encoder using a compression algorithm that is less complex than another encoder is configured to compress the data prior to the other encoder.

For simplification of explanation purposes, the encoders 302, 304 and 306 are encoders which use a "constant encoding" compression algorithm, an "immediates" compression algorithm and a "dictionary" compression algorithm, respectively. Examples of processing devices used to implement features of the disclosure, however, include using different compression algorithms in addition to or alternative to these compression algorithms indicated above.

The constant encoding compression algorithm, used by first encoder 302, compresses data that is a combination of known constants. The immediates compression algorithm, used by second encoder 304, is more complex than the constant encoding algorithm. That is, the immediates compression algorithm recognizes more complex patterns than the constant encoding compression algorithm. The immediates compression algorithm, however, typically compresses data with higher latency (e.g., compression latency and decompression latency) and uses more power consumption than the constant encoding compression algorithm. Likewise, the dictionary compression algorithm used by third encoder 304 is more complex and compresses data at a higher compression ratio than the immediates compression algorithm, but typically compresses the data with higher latency and uses more power consumption than the immediates compression algorithm.

When the portion of data is compressed by the first encoder 302 using the constant encoding compression algorithm, the compressed data (i.e., Data Out) is provided to the MUX 312. The processor 102 determines whether the portion of data is compressed by the first encoder 302 according to a compression metric. For example, the processor 102 determines whether the portion of data is compressed by the first encoder 302 according to a compression ratio. The compression ratio is, for example, a ratio between the uncompressed size of the portion of data and the compressed size of the portion of data. Alternatively, the compression ratio is the ratio between a compressed data rate (i.e., an amount of data compressed over a period of time or clock cycles) and an uncompressed data rate (i.e., an amount of uncompressed data received over a period of time or clock cycles). Compression metrics also include, for example, a compression latency, a compression size (e.g., a number of compressed lines) and a decompression latency.

The processor 102 determines, for example, whether or not a portion of data has been successfully compressed by an encoder (e.g., first encoder 302) by comparing the compression ratio to a threshold compression ratio. For example, when the compression ratio of compressing a portion of data is equal to or greater than a threshold compression ratio, the processor 102 determines that the portion of data has been successfully compressed by an encoder. Alternatively, when the compression ratio is less than a threshold compression ratio, the processor 102 determines that the portion of data has not been successfully compressed by an encoder. The threshold compression ratio is determined prior to runtime of a program and, alternatively or additionally, is dynamically determined during execution of a program.

When the processor 102 determines that the portion of data has been successfully compressed by the first encoder 302 according to the compression ratio, an indication (e.g., First_Success and Second_Success shown in FIG. 3) of the result of the determination made by the processor 102 is provided to storage element 308, MUX 312 and link 314. The processor is configured to provide, for example, indications for both the portion of data being successfully compressed and the portion of data not being successfully compressed (e.g., provide values of 1 and 0 for each result). Alternatively, the processor is configured to provide, a single indication that the portion of data has been successfully compressed or not compressed (e.g., a storage element automatically defaults to one of the first and second states and the single indication changes the state from the default state). For simplification purposes, in examples described herein, the processor is configured to provide indications for both the portion of data being successfully compressed and the portion of data not being successfully compressed.

When each storage element 308 and 310 is in a first state, the stored portion of data is not provided to the corresponding encoder (i.e., second encoder 304 and third encoder 306). But when each storage element 308 and 310 is in a second state, the stored portion of data is provided to the corresponding encoder (i.e., second encoder 304 and third encoder 306) for compression.

Accordingly, when storage element 308 receives the indication (i.e., First_Success) that the portion of data has been successfully compressed, storage element 308 remains in the first state (or changes to the first state if in a second state) and does not provide the stored portion of data. In addition, when MUX 312 receives the indication (i.e., First_Success) that the portion of data has been successfully compressed, the compressed portion of data received from the first encoder 302 is selected by MUX 312 and provided (i.e., Line Out) across the link 314.

When the processor 102 determines that the portion of data has not been successfully compressed by the first encoder 302 according to the compression ratio (or another compression metric), the indication (i.e., First_Success) that the portion of data has not been successfully compressed is provided to storage element 308, MUX 312 and link 314. In response to receiving the indication (i.e., First_Success) that the portion of data has not been successfully compressed, the state of storage element 308 is changed (or maintained if already in a second state) from the first state to the second state and the stored portion of data is provided to the second encoder 304 for compression using the immediates compression algorithm. The portion of data is then compressed by the second encoder 304 using the immediates compression algorithm and the compressed data (i.e., Data Out) is provided to the MUX 312.

The processor 102 determines whether or not the portion of data is compressed by the second encoder 304 according to the compression metric (e.g., the compression ratio). An indication (i.e., Second_Success) of the result of the determination is provided to storage element 308, MUX 312 and link 314.

For example, when the processor 102 determines that the portion of data has been successfully compressed by the second encoder 304 according to the compression ratio, the indication (i.e., Second_Success) that the portion of data has been successfully compressed by the second encoder 304 is provided to storage element 308, MUX 312 and link 314. When storage element 310 receives the indication (i.e., Second_Success) that the portion of data has been successfully compressed by the second encoder 304, storage element 310 remains in the first state and does not provide the stored portion of data to the third encoder 306. In addition, when MUX 312 receives the indication (i.e., Second_Success) that the portion of data has been successfully compressed by the second encoder 304, the compressed portion of data received from the second encoder 304 is selected by MUX 312 and provided as the compressed portion of data (i.e., Line Out) across the link 314.

When the processor 102 determines that the portion of data has not been successfully compressed by the second encoder 304 according to the compression ratio, the processor 102 provides the indication (i.e., Second_Success) to storage element 310, MUX 312 and link 314 that the portion of data has not been successfully compressed. In response to receiving the indication (i.e., Second_Success) that the portion of data has not been successfully compressed by the second encoder 304, the state of storage element 310 is changed from the first state to the second state and the stored portion of data is provided to the third encoder 306 for compression using the dictionary compression algorithm.

The portion of data is then compressed by the third encoder 306 using the dictionary compression algorithm and the compressed data (i.e., Data Out) is provided to the MUX 312. Based on the received indication (i.e., Second_Success) that the portion of data has not been successfully compressed by the second encoder 304, MUX 312 selects the compressed portion of data received from the third encoder 306 and provides the compressed portion of data (i.e., Line Out) across the link 314.

According to the arrangement shown in FIG. 3, each portion of unsuccessfully compressed data (i.e., determined as not being successfully compressed according to the compression metric) by the first encoder 302 and/or the second encoder 304 is not selected by MUX 312 and, therefore, is not provided across the link 314. As previously described, however, examples of combinational logic, other than MUX 312, include logic configured to provide portions of unsuccessfully compressed data. For example, when it is determined that the second encoder 304 has successfully compressed the data, the portion of the data that was compressed by the first encoder 302, but which was not successfully compressed according to the compression metric (e.g., a compression ratio) by the first encoder 302 is also provided across the link 314. Alternatively, when it is determined that the third encoder 306 has successfully compressed the data, the portions of unsuccessfully compressed data from the first encoder 302 and the second encoder 304 are also provided across the link 314.

Because the data is not compressed by more complex encoders when it is determined that the data is successfully compressed using a less complex encoder, the overall compression latency and power consumption to execute the program is reduced because the additional compression latency and power consumption, which would otherwise result from also compressing the data using the more complex algorithms, is prevented. Further, the reduced latency and power consumption does not come at the expense of a reduced compression ratio because successful compression of each portion of data is determined according to a target compression ratio.

Figure 4:
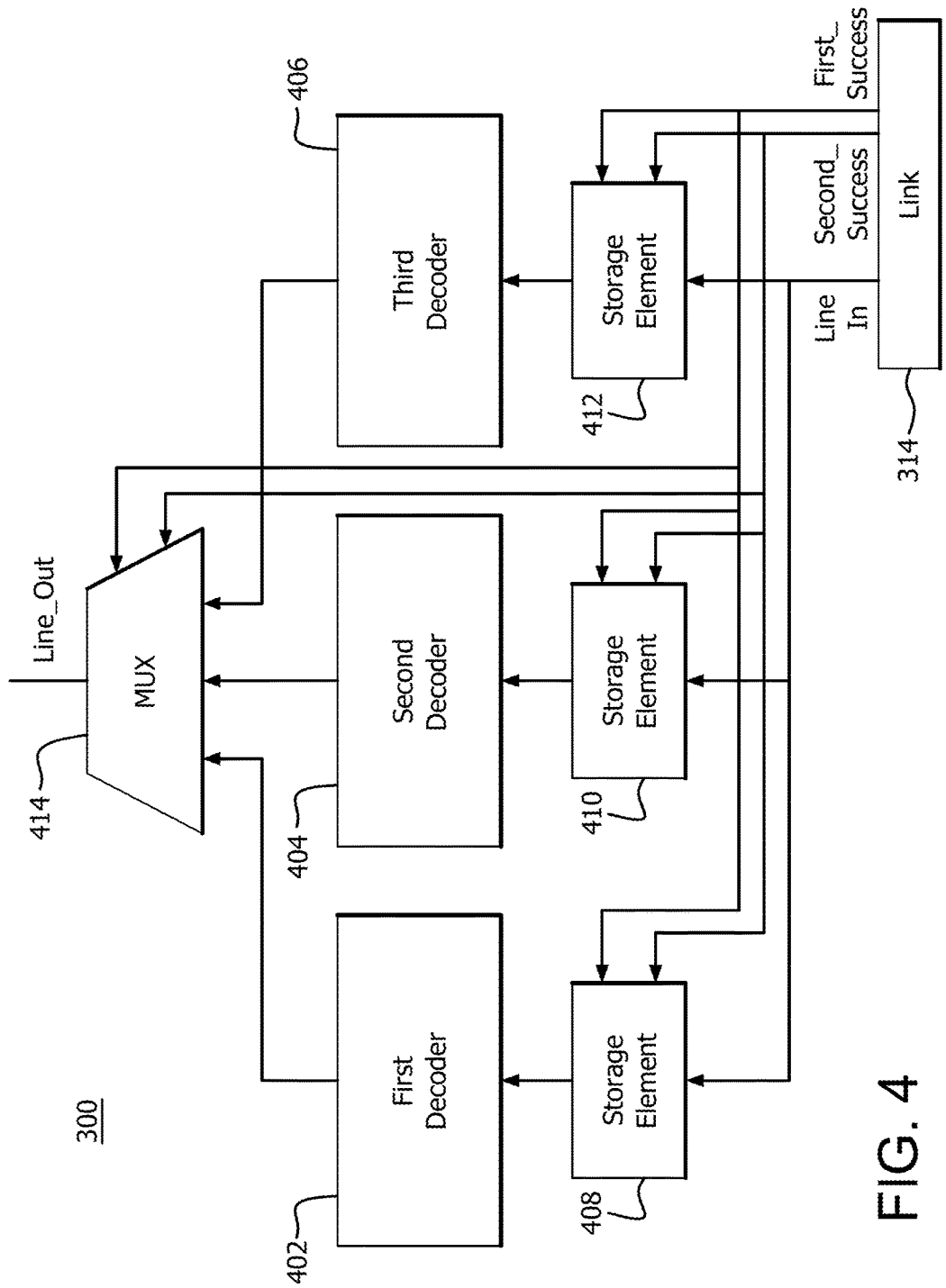
FIG. 4 is a block diagram illustrating an example flow of decompressing the data at another side of the link of the processing device shown in FIG. 3.

FIG. 4 is a block diagram illustrating an example flow of decompressing the data compressed in FIG. 3 at second side of the link 314. As shown in FIG. 4, the processing device 300 includes a first decoder 402, a second decoder 404 and a third decoder 406. The first decoder, configured to decompress data which has been compressed using the constant encoding compression algorithm, is in communication with data storage element 408. The second decoder 404, configured to decompress data which has been compressed using the immediates compression algorithm, is in communication with data storage element 410. The third decoder 406, configured to decompress data which has been compressed using the dictionary compression algorithm, is in communication with data storage element 412.

The data storage elements 408, 410, and 412 shown in FIG. 4, are optional. That is, the compressed data is alternatively provided, for example, to decoders 402, 404 and 406 without using data storage elements 408, 410, and 412. While use of the storage elements 408, 410, and 412 facilitates a reduction in power consumption, the use of the storage elements 408, 410, and 412 does incur some additional latency. Three decoders and three data storage elements are shown in FIG. 4 for simplification purposes. Examples of processing devices used to implement features of the disclosure include any number of decoders and data storage elements.

Each decoder 402, 404 and 406 is, for example, implemented in hardware (e.g., a part of encoder-decoder 202 shown in FIG. 2), software or a combination of hardware and software to compress data for executing a program. When implemented in hardware, each decoder 402, 404 and 406 is, for example, a separate hardware component (e.g., a CODEC). Alternatively, each decoder 402, 404 and 406 is part of the same hardware component. Each decoder 402, 404 and 406 is, for example, controlled by processor 102 to compress each portion of data using a different compression algorithm. Alternatively, each decoder 402, 404 and 406 includes a dedicated processor to compress the data using a different compression algorithm.

As shown in FIG. 4, each storage element 408, 410, and 412 is configured to receive compressed portions of data (i.e., Line In) that are provided by MUX 312 in FIG. 3 across the link 314. In addition, each storage element 408, 410, and 412 and MUX 414 are configured to receive the indication (i.e., First_Success) of whether or not the portion of data has been successfully compressed by the first encoder 302 and the indication (i.e., Second_Success) of whether or not the portion of data has been successfully compressed by the second encoder 304. Because the processor 102 has previously determined which encoder has successfully compressed the portion of data, however, a single decoder (e.g., decoder 402, decoder 404 or decoder 406) is activated to decompress each portion of compressed data of a program. Accordingly, the decompression latency and power consumption to execute the program is reduced because the decompression latency and power consumption, which would otherwise result from decompressing each portion of data according to the more complex algorithms, is prevented.

Similar to the storage elements described in FIG. 3, when each storage element 408, 410 and 412 is in a first state, the stored portion of data is not provided to a corresponding decoder 402, 404 and 406, but when each storage element 408, 410 and 412 is in a second state, the stored portion of data is provided to the corresponding encoder decoder 402, 404 and 406 for decompression.

Processor 102 determines whether to provide the stored compressed data to the first decoder 402 from the indications (i.e., First_Success and Second_Success). For example, when storage element 408 receives the indication (i.e., First_Success) that the portion of data has been successfully compressed by the first encoder 302, the state of storage element 408 is changed (or maintained if already in a second state) from the first state to the second state and the stored portion of compressed data is provided to the first decoder 402 for decompression using the constant encoding compression algorithm. The decompressed data is then sent to MUX 414. In addition, because MUX 414 also receives the indication (i.e., First_Success) that the portion of data has been successfully compressed by the first encoder 302, the decompressed portion of data received from the first decoder 402 is selected by MUX 414 and provided as the decompressed portion of data (i.e., Line Out). When storage element 408 receives the indication (i.e., First_Success) that the portion of data has not been successfully compressed by the first encoder 302, the state of storage element 408 is changed (or maintained if already in a first state) from the second state to the first state and the stored portion of compressed data is not provided to the first decoder 402.

When storage element 410 receives the indication (i.e., First_Success) that the portion of data has not been successfully compressed by the first encoder 302 and the indication (i.e., Second_Success) that the portion of data has been successfully compressed by the second encoder 304, the state of storage element 410 is changed (or maintained if already in a second state) from the first state to the second state and the stored portion of compressed data is provided to the second decoder 404 for decompression using the immediates compression algorithm. The decompressed data is then sent to MUX 414. In addition, because MUX 414 also receives the indication (i.e., First_Success) that the portion of data has not been successfully compressed by the first encoder 302 and the indication (i.e., Second_Success) that the portion of data has been successfully compressed by the second encoder 304, the decompressed portion of data received from the second decoder 404 is selected by MUX 414 and is provided as the decompressed portion of data (i.e., Line Out). When storage element 410 receives the indications (i.e., First_Success and Second_Success) that the portion of data has not been successfully compressed by the first encoder 302 and the second encoder 304, the state of storage element 410 is changed (or maintained if already in a first state) from the second state to the first state and the stored portion of compressed data is not provided to the second decoder 404.

When storage element 412 receives the indications (i.e., First_Success and Second_Success) that the portion of data has not been successfully compressed by the first encoder 302 and the second encoder 304, the state of storage element 412 is changed (or maintained if already in a second state) from the first state to the second state and the stored portion of compressed data is provided to the third decoder 406 for decompression using the dictionary compression algorithm. The decompressed data is then sent to MUX 414. In addition, because MUX 414 also receives the indications (i.e., First_Success and Second_Success) that the portion of data has not been successfully compressed by the first encoder 302 and the second encoder 304, the decompressed portion of data received from the third decoder 406 is selected by MUX 414 and is provided as the decompressed portion of data (i.e., Line Out). When storage element 412 receives the indication (i.e., First_Success) that the portion of data has been successfully compressed by the first encoder 302 or the indication (i.e., Second_Success) that the portion of data has been successfully compressed by the second encoder 304, the state of storage element 412 is changed (or maintained if already in a first state) from the second state to the first state and the stored portion of compressed data is not provided to the third decoder 406.

Figure 5:
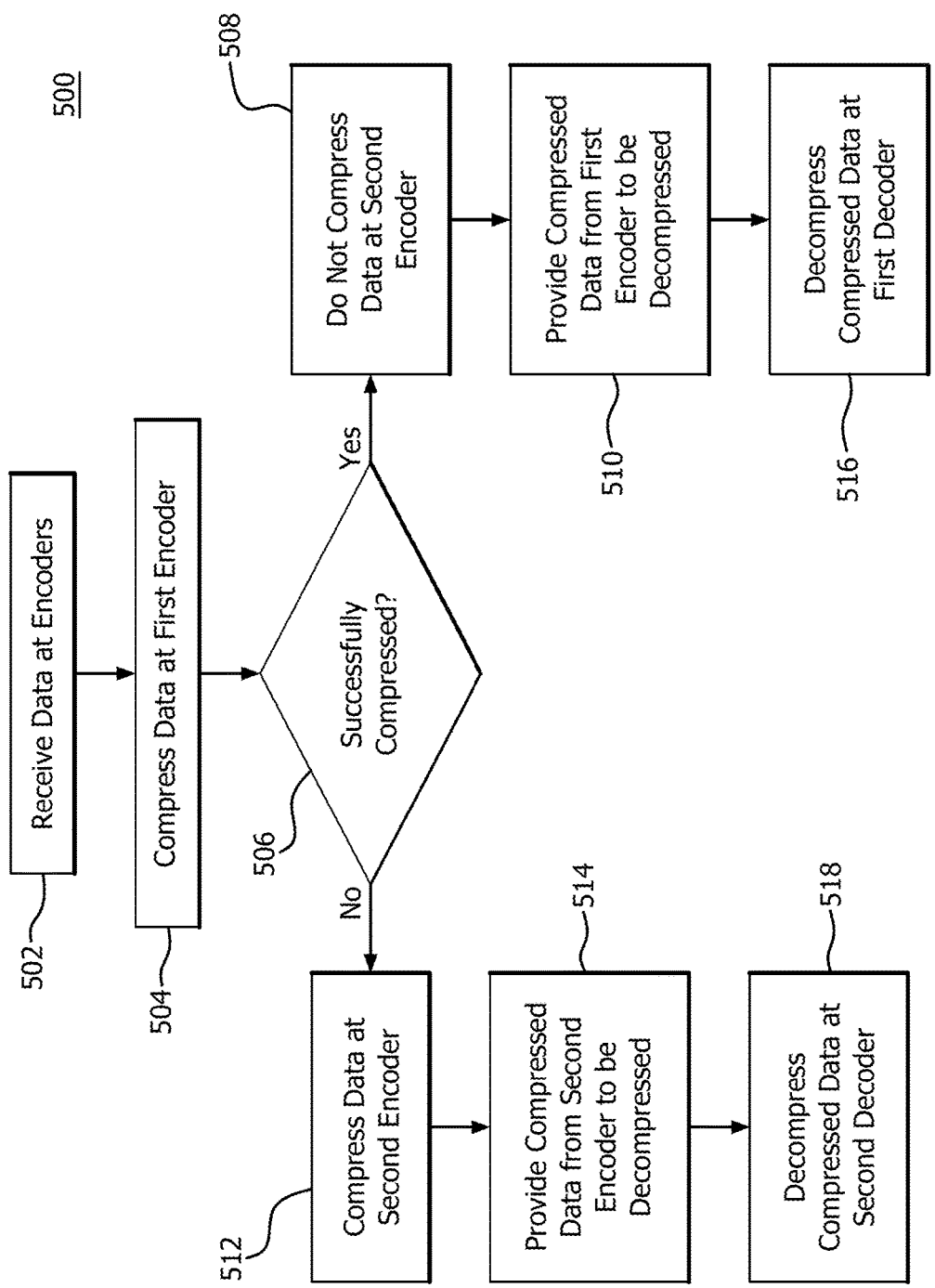
FIG. 5 is a flow diagram illustrating an exemplary method of compression data using a metadata cache according to features of the disclosure.

FIG. 5 is a flow diagram illustrating an exemplary data processing method 500 using tiered compression. As shown at block 502, the method 500 includes receiving a portion of data at a plurality of encoders. For example, the portion of data is received at an encoder or at a data storage element in communication with an encoder. The encoders are arranged in a hierarchy such that one encoder (e.g., a first encoder) is configured to compress the portion of data prior to another encoder (e.g., a second encoder) more complex than the one encoder.

As shown at block 504, the method 500 includes compressing data at a first encoder using a first compression algorithm. For example, the first compression algorithm is a constant encoding algorithm. As shown at decision block 506, the method 500 includes determining whether or not the portion of data is successfully compressed. For example, it is determined (e.g., by processor 102) whether the portion of data is successfully compressed by the first encoder according to a compression ratio.

When it is determined, at block 506, that the portion of data is successfully compressed by the first encoder, the portion of data is not compressed at the second encoder, as shown at block 508. For example, an indication is provided to a data storage element that the portion of data is successfully compressed by the first encoder, which prevents the stored portion of data from being provided to the second encoder. The data compressed by the first encoder is then provided (e.g., across a link) for decompression, as shown at block 510. For example, the compressed data is provided by combinational logic, such as a MUX, based on the indication that the portion of data is successfully compressed by the first encoder.

When it is determined, at block 506, that the portion of data is not successfully compressed by the first encoder, the portion of data is compressed by the second encoder using a second compression algorithm which is more complex than the first algorithm, as shown at block 512. For example, an indication is provided to a data storage element that the portion of data is not successfully compressed by the first encoder, which causes the stored portion of data to be provided to the second encoder. The data compressed by the second encoder is then provided (e.g., across a link) for decompression, as shown at block 514. For example, the compressed data is provided by combinational logic, such as a MUX, based on the indication that the portion of data is not successfully compressed by the first encoder.

As shown at block 516 on the path at the right side of FIG. 5, the data compressed by the first encoder is decompressed by a corresponding decoder using a decompression algorithm corresponding to the compression algorithm used by the first encoder. In the alternative path shown on the left side of FIG. 5, the data compressed by the second encoder is decompressed by a corresponding decoder using a decompression algorithm corresponding to the compression algorithm used by the second encoder.

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A processing device comprising:
   a plurality of encoders each configured to compress a portion of data using a different compression algorithm; and
   one or more processors configured to:
     cause an encoder, of the plurality of encoders, to compress the portion of data when it is determined that the portion of data, which is compressed by another encoder configured to compress the portion of data prior to the encoder in an encoder hierarchy, is not successfully compressed according to a compression metric by the other encoder in the encoder hierarchy; and
     prevent the encoder from compressing the portion of data when it is determined that the portion of data is successfully compressed according to the compression metric by the other encoder in the encoder hierarchy.

2. The processing device according to claim 1, wherein the compression metric is one of a compression ratio, a compression latency, a compression size and a decompression latency.

3. The processing device according to claim 1, wherein the compression metric is a compression ratio and the one or more processors are further configured to:
   compare the compression ratio to a threshold compression ratio;
   determine that the portion of data is not successfully compressed by the other encoder when the compression ratio is less than the threshold compression ratio; and
   determine that the portion of data is successfully compressed by the other encoder when the compression ratio is equal to or greater than the threshold compression ratio.

4. The processing device according to claim 1, further comprising a data storage element configured to store the portion of data to be compressed and state information,
   wherein the encoder is in communication with the data storage element and is configured to receive the portion of data from the data storage element and compress the portion of data when it is determined that the portion of data is not successfully compressed according to the compression metric by the other encoder in the encoder hierarchy.

5. The processing device according to claim 4, further comprising:
an additional encoder configured to compress the portion of data after the encoder in the encoder hierarchy; and
an additional data storage element in communication with the additional encoder and configured to store the portion of data to be compressed and state information,
wherein the data storage element and the additional data storage element are latches each comprising a plurality of inputs and an output.

6. The processing device according to claim 1, wherein the encoder hierarchy is based on a complexity of the different compression algorithm used by each of the plurality of encoders to compress the portion of data, and
the encoder is configured to compress the portion of data with a first compression algorithm, the other encoder is configured to compress the portion of data with a second compression algorithm and the first compression algorithm is more complex than the second compression algorithm such that, on average, the encoder is configured to compress the portion of data with a higher compression ratio than the other encoder.

7. The processing device according to claim 1, further comprising a multiplexor configured to:
receive at least the portion of data compressed by the other encoder;
receive at least an indication of whether the portion of data is successfully compressed by the other encoder according to the compression metric; and
when the portion of data is indicated as being successfully compressed by the other encoder according to the compression metric, select the portion of data compressed by the other encoder and provide the portion of data compressed by the other encoder to be decompressed; and
when the portion of data is indicated as not being successfully compressed by the other encoder according to the compression metric, receive the portion of data compressed by the encoder, select the portion of data compressed by the encoder and provide the portion of data compressed by the encoder to be decompressed.

8. The processing device according to claim 1, further comprising:
a plurality of decoders each configured to decompress the portion of data compressed by a corresponding encoder,
wherein the one or more processors are further configured to cause one of the decoders to decompress the portion of data using a decompression algorithm corresponding to the compression algorithm of one of the encoders when it is determined that the portion of data is successfully compressed according to the compression metric by the one encoder.

9. The processing device according to claim 8, further comprising a plurality of compressed data storage elements each configured to store the portion of data compressed by the corresponding encoder and state information,
wherein each decoder is in communication with one of the compressed data storage elements, and
the one decoder is configured to receive the portion of compressed data from the one compressed data storage element when it is determined that the portion of data is successfully compressed according to the compression metric by the one encoder.

10. A data processing method comprising:
receiving a portion of data at a first encoder and a second encoder;
compressing the portion of data at the first encoder using a first compression algorithm;
when it is determined that the portion of data, compressed by the first encoder, is not successfully compressed according to a compression metric, compressing the portion of data at the second encoder, which is configured to compress the portion of data after the first encoder in an encoder hierarchy, using a second compression algorithm different from the first algorithm; and
when it is determined that the portion of data, compressed by the first encoder in the encoder hierarchy, is successfully compressed according to the compression metric, preventing the second encoder from compressing the portion of data.

11. The method according to claim 10, wherein the compression metric is one of a compression ratio, a compression latency, a compression size and a decompression latency.

12. The method according to claim 10, wherein the compression metric is a compression ratio and the method further comprises:
compare the compression ratio to a threshold compression ratio; and
determine that the portion of data is not successfully compressed by the other encoder when the compression ratio is less than the threshold compression ratio;
determine that the portion of data is successfully compressed by the other encoder when the compression ratio is equal to or greater than the threshold compression ratio.

13. The method according to claim 10, wherein receiving the portion of data at the second encoder comprises receiving the portion of data at a data storage element associated with the second encoder, and
the method further comprises compressing the portion of data stored in the data storage element when it is determined that the portion of data is not successfully compressed according to the compression metric by the other encoder in the encoder hierarchy.

14. The method according to claim 10, wherein the encoder hierarchy is based on a complexity of the different compression algorithm used by each of the first encoder and the second encoder to compress the portion of data, and
the first encoder is configured to compress the portion of data with a first compression algorithm, the second encoder is configured to compress the portion of data with a second compression algorithm and the first compression algorithm is less complex than the second compression algorithm such that, on average, the second encoder is configured to compress the portion of data with a higher compression ratio than the first encoder.

15. The method according to claim 10, the method further comprising:
when the portion of data is indicated as being successfully compressed by the first encoder according to the compression metric:
selecting the portion of data compressed by the first encoder; and
providing the portion of data compressed by the first encoder to be decompressed; and
when the portion of data is indicated as not being successfully compressed by the first encoder according to the compression metric:
selecting the portion of data compressed by the second encoder; and providing the portion of data compressed by the second encoder to be decompressed.

16. The method according to claim 10, further comprising:
receiving the portion of compressed data at a first decoder and a second decoder;
decompressing the portion of compressed data, at one of the first decoder and the second decoder, using a decompression algorithm corresponding to the compression algorithm of one of the first encoder and the second encoder.

17. The method according to claim 16, wherein receiving the portion of compressed data at the first decoder comprises receiving the portion of data at a first compressed data storage element associated with the first decoder and receiving the portion of compressed data at the second decoder comprises receiving the portion of data at a second compressed data storage element associated with the second decoder, and the method further comprises:
when the portion of compressed data is compressed by the first encoder, compressing, at the first decoder, the portion of compressed data in the first compressed data storage element; and
when the portion of compressed data is compressed by the second encoder, compressing, at the second decoder, the portion of compressed data in the second compressed data storage element.

18. A non-transitory computer readable medium having instructions for causing a computer to execute a data processing method comprising:
receiving a portion of data at a first encoder and a second encoder;
compressing the portion of data at the first encoder using a first compression algorithm;
when it is determined that the portion of data, compressed by the first encoder, is not successfully compressed according to a compression metric, compressing the portion of data at the second encoder, which is configured to compress the portion of data after the first encoder in an encoder hierarchy, using a second compression algorithm different from the first algorithm; and
when it is determined that the portion of data, compressed by the first encoder in the encoder hierarchy, is successfully compressed according to the compression metric, preventing the second encoder from compressing the portion of data.

19. The computer readable medium of claim 18, wherein the instructions further cause the computer to:
when the portion of data is indicated as being successfully compressed by the first encoder according to the compression metric:
select the portion of data compressed by the first encoder; and
provide the portion of data compressed by the first encoder to be decompressed; and
when the portion of data is indicated as not being successfully compressed by the first encoder according to the compression metric:
select the portion of data compressed by the second encoder; and
provide the portion of data compressed by the second encoder to be decompressed.

20. The computer readable medium of claim 19, wherein the instructions further cause the computer to:
receive the portion of compressed data at a first decoder and a second decoder;
decompress the portion of compressed data, at one of the first decoder and the second decoder, using a decompression algorithm corresponding to the compression algorithm of one of the first encoder and the second encoder.

* * * * *

UNITED STATES PATENT AND TRADEMARK OFFICE
CERTIFICATE OF CORRECTION

PATENT NO. : 10,411,731 B1
APPLICATION NO. : 16/140025
DATED : September 10, 2019
INVENTOR(S) : Das et al.

Page 1 of 1

It is certified that error appears in the above-identified patent and that said Letters Patent is hereby corrected as shown below:

In the Specification

At Column 1, Line 4, after the title of the application "DEVICE AND METHOD OF COMPRESSING DATA USING TIERED DATA COMPRESSION", and before the "BACKGROUND" heading, please insert the following paragraph:

--STATEMENT REGARDING FEDERALLY SPONSORED RESEARCH OR DEVELOPMENT
This invention was made with Government support under PathForward Project with Lawrence Livermore National Security (Prime Contract No. DE-AC52-07NA27344, Subcontract No. B620717) awarded by the DOE. The Government has certain rights in this invention.--.

Signed and Sealed this
Second Day of June, 2020

Andrei Iancu
*Director of the United States Patent and Trademark Office*